United States Patent
Satoh et al.

(10) Patent No.: US 6,404,302 B1
(45) Date of Patent: Jun. 11, 2002

(54) SURFACE ACOUSTIC WAVE FILTER UTILIZING A TRANSMISSION LINE WITH PHASE CHARACTERISTICS THAT INCREASE FILTER OUT OF BAND ATTENUATION

(75) Inventors: Yuki Satoh; Toru Sakuragawa; Kozo Murakami, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/600,233
(22) PCT Filed: Nov. 11, 1999
(86) PCT No.: PCT/JP99/06272
§ 371 (c)(1),
(2), (4) Date: Sep. 5, 2000
(87) PCT Pub. No.: WO00/30252
PCT Pub. Date: May 25, 2000

(30) Foreign Application Priority Data

Nov. 13, 1998 (JP) ............................................. 10-323236

(51) Int. Cl.⁷ ................................................ H03H 9/64
(52) U.S. Cl. ...................................... 333/193; 333/195
(58) Field of Search .................................. 333/193–196

(56) References Cited

U.S. PATENT DOCUMENTS 5,499,002 A * 3/1996 Kinsman ................. 333/195 X
5,905,418 A * 5/1999 Ehara et al. ................. 333/193

FOREIGN PATENT DOCUMENTS

| JP | 43-2402 | 1/1968 |
|---|---|---|
| JP | 43-7739 | 3/1968 |
| JP | 51-142246 | 12/1976 |
| JP | 61-193501 | 8/1986 |
| JP | 7-15279 | 1/1995 |
| JP | 722892 | 1/1995 |
| JP | 7-231241 | 8/1995 |
| JP | 07-263995 | 10/1995 |
| JP | 10-13187 | 1/1998 |
| JP | 10-65489 | 3/1998 |
| JP | 10-93376 | 4/1998 |
| JP | 10-270976 | 10/1998 |

OTHER PUBLICATIONS

Japanese search report for PCT/JP99/06272 dated Feb. 22, 2000.
English translation of Form PCT/ISA/210.

* cited by examiner

*Primary Examiner*—Benny Lee
*Assistant Examiner*—Barbara Summons
(74) *Attorney, Agent, or Firm*—Ratner & Prestia (57) ABSTRACT

The present invention relates to a surface acoustic wave (SAW) filter which is used for cellular phones and other mobile communication equipment. The object of the present invention is to realize a SAW filter of which attenuation characteristics and pass characteristics can be set arbitrarily. The SAW filter of the present invention comprises comb-shaped electrodes facing each other disposed on the same piezoelectric substrate, at least two resonators with an input and output terminals, and an equivalent transmission line which is connected between an output terminal of a first resonator and an input terminal of a second resonator. The phase of the transmission line can be adjusted from 5 degrees to 175 degrees arbitrarily at the series resonance frequency of the resonators. This structure realizes a band-stop filter or a band-pass filter whose attenuation characteristics and pass characteristics can be set arbitrarily.

11 Claims, 13 Drawing Sheets

SURFACE ACOUSTIC WAVE FILTER UTILIZING A TRANSMISSION LINE WITH PHASE CHARACTERISTICS THAT INCREASE FILTER OUT OF BAND ATTENUATION

This application is a U.S. National Phase Application of PCT International Application PCT/JP99/06272.

FIELD OF THE INVENTION

The present invention relates to a surface acoustic wave filter which is used for cellular phones and other mobile communication equipment.

BACKGROUND OF THE INVENTION

Figure 10:
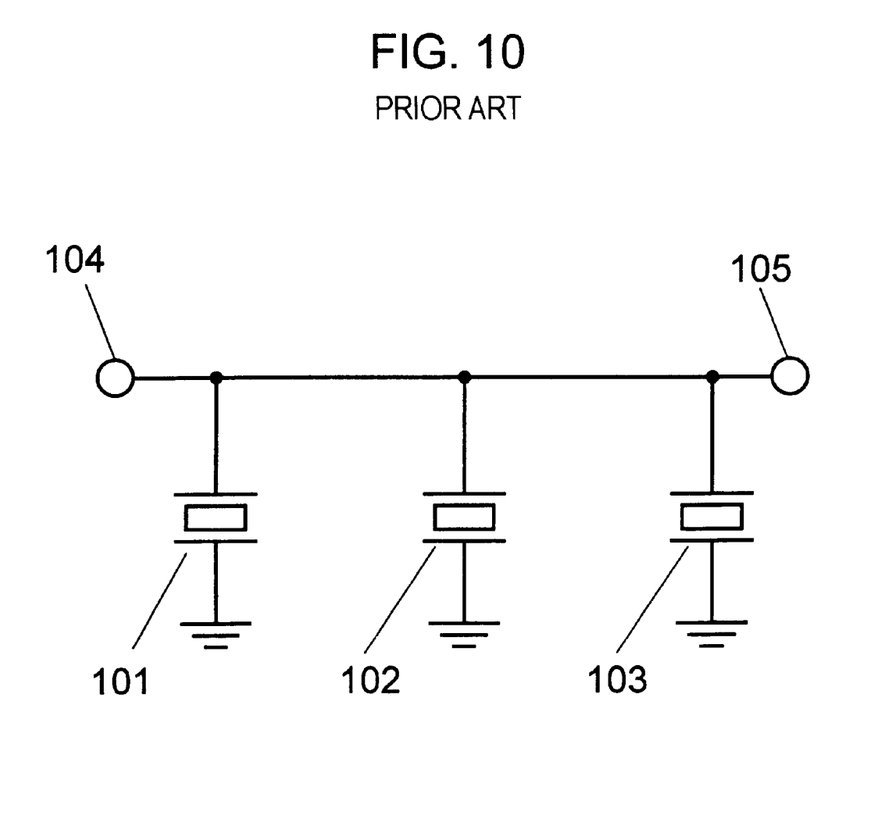
FIG. 10 shows a circuit diagram of a conventional SAW filter.

FIG. 10 shows a circuit diagram of a conventional SAW (surface acoustic wave) filter. FIG. 10 shows SAW resonant elements 101, 102, and 103 which are disposed on a piezoelectric substrate, and input terminal 104 and output terminal 105. Here, three resonators configure a band-stop filter.

Figure 11A:
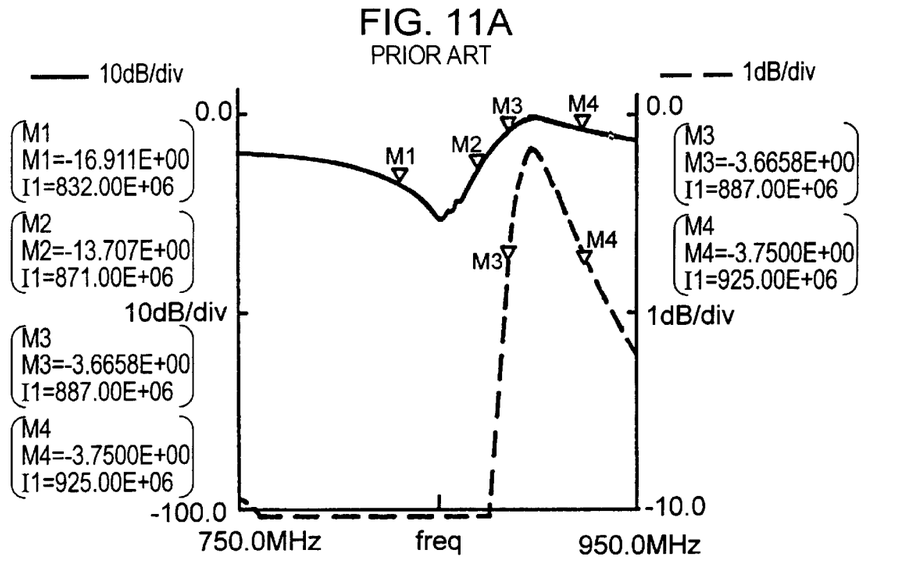
FIG. 11A shows an electrical characteristic of the conventional filter at a narrow range from 750 MHz to 950 MHz. Broken line shows the same in an expanded scale of ordinate.
Figure 11B:
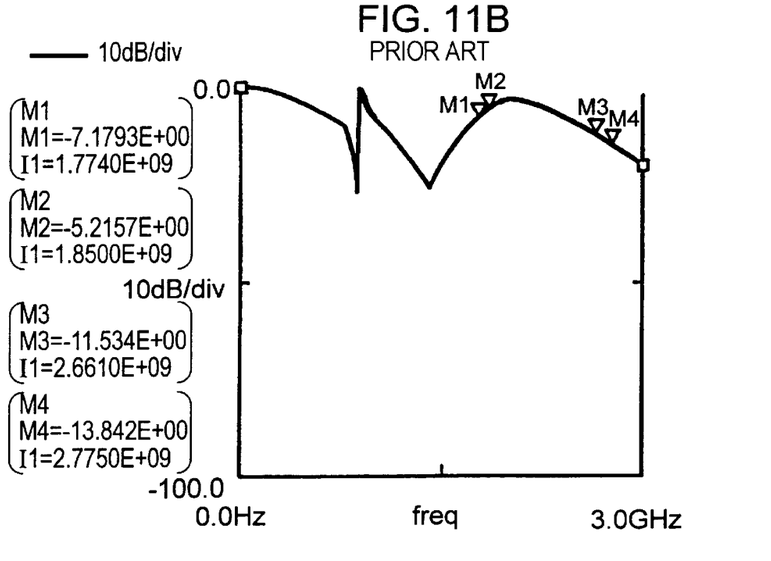
FIG. 11B shows an electrical characteristic of the conventional filter at a wide range from 0 Hz to 3.0 GHz.
Figure 12:
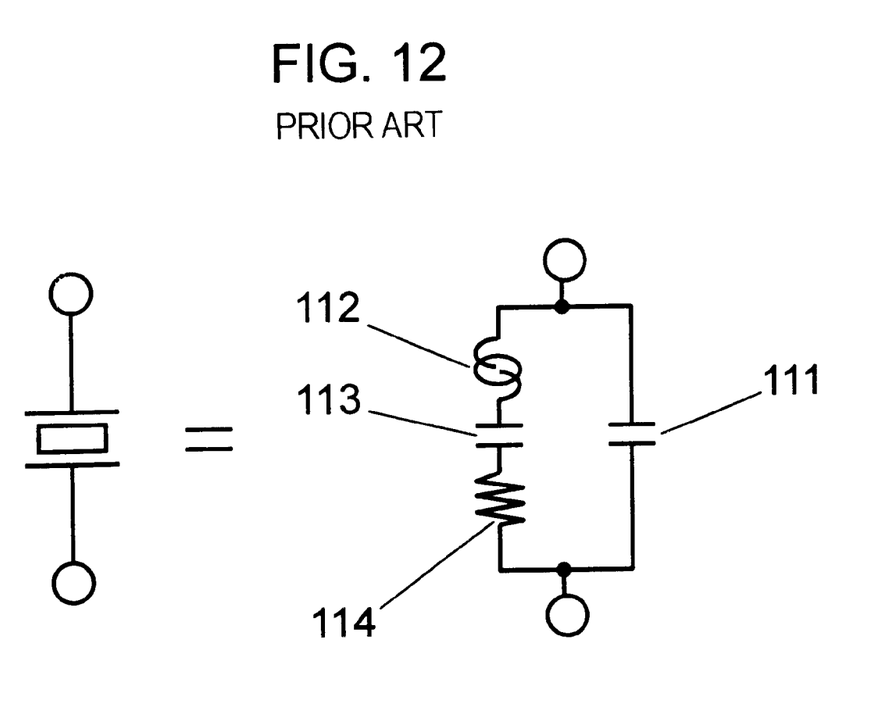
FIG. 12 shows an equivalent circuit diagram of the conventional SAW filter.

FIG. 11 shows characteristics of the band-stop filter configured by three resonators which are disposed on a piezoelectric substrate made of LiTaO3 (lithium tantalate) using conventional circuit structure. FIG. 12 shows an equivalent circuit diagram of the SAW resonant element shown in FIG. 10. In FIG. 12, reference number 111 is a parallel capacitor C0, reference number 112 an equivalent series inductor L1, reference number 113 an equivalent series capacitor C1, and reference number 114 an equivalent series resistor R1.

But the material property of the piezoelectric substrate shown in FIG. 12 mentioned above determines a physical constant, or capacitance ratio η=C0/C1. A series resonance frequency Fs and a parallel resonance frequency Fp of a SAW resonator element (for LiTaO3, η=about 13) are $F_s = 1/(2\pi(L1 \times C1)^{0.5})$ $F_p = 1/(2\pi(L1 \times C1 \times C2/(C1+C2))^{0.5})$ respectively. Therefore, because capacitors C1 and C2 share a relation determined by the capacitance ratio η, a frequency separation between the series resonance frequency and the parallel resonance frequency of the SAW resonant element as electrical characteristics can not be set arbitrarily. As a result, the attenuation characteristics and the pass characteristics—both are the important filter characteristics—also have a limitation as shown in FIG. 11.

DISCLOSURE OF THE INVENTION

An object of the present invention is to attain a SAW filter which can set attenuation characteristics and pass characteristics arbitrarily.

In order to attain the object, the SAW filter of the present invention comprises comb-shaped electrodes facing each other disposed on the same piezoelectric substrate, at least two resonators with an input and output terminals, and an equivalent transmission line which is connected between an output terminal of the first resonator and an input terminal of a second resonator. The phase of the transmission line can be adjusted from 5 degrees to 175 degrees arbitrarily at the series resonance frequency of the resonators.

The band-stop filter or the band-pass filter based on the present invention can set the attenuation characteristics and the pass characteristics arbitrarily.

DESCRIPTION OF THE PREFERRED EMBODIMENT

A surface acoustic wave (SAW) filter of the present invention comprises, at least two resonators each having comb-shaped electrodes facing each other disposed on the same piezoelectric substrate an input terminal, output terminal, and an equivalent transmission line connected between an output terminal of a first resonator and an input terminal of a second resonator, to form a band-stop filter. The phase of the transmission line can be adjusted from 5 degrees to 175 degrees arbitrarily at the series resonance frequency of the resonators. As a result, the present invention allows the band-stop filter to be provided with fairly arbitrary attenuation and pass characteristics.

Preferably, a SAW filter of the present invention comprises at least two resonators, each having comb-shaped electrodes facing each other disposed on the same piezoelectric substrate, an input terminal and an output terminal, each output terminal of the resonators grounded, and an equivalent transmission line connected between input terminals of the resonators, to form a stop-band filter. The phase of the transmission line can be adjusted from 5 degrees to 175 degrees arbitrarily at the parallel resonance frequency of the resonators. As a result, the present invention allows the stop-band filter to be provided with fairly arbitrary attenuation and pass characteristics.

Still preferably, in a SAW filter of the present invention, an output terminal of a first resonator with comb-shaped electrodes facing each other disposed on the same piezoelectric substrate and with an input terminal and an output terminal is coupled to an input terminal of a second resonator with comb-shaped electrodes facing each other disposed on the piezoelectric substrate and with an input terminal and an output terminal, an output terminal of a third resonator with comb-shaped electrodes facing each other disposed on the piezoelectric substrate and with an input terminal and an output terminal is coupled to an input terminal of a fourth resonator with comb-shaped electrodes facing each other disposed on the piezoelectric substrate and with an input terminal and an output terminal, and an equivalent transmission line is coupled between a node between the first resonator and the second resonator and a node between the third resonator and the fourth resonator, to form a passband filter. The phase of the transmission line can be adjusted from 5 degrees to 175 degrees arbitrarily at the series resonance frequency of the first or third resonator or at the series resonance frequency of the second or fourth resonator. As a result, the present invention allows the band-pass filter to be provided with arbitrary attenuation and pass characteristics at a certain degree.

Preferably, in a SAW filter of the present invention, an output terminal of a first resonator with comb-shaped electrodes facing each other disposed on the same piezoelectric substrate and with an input terminal and an output terminal is coupled to an input terminal of a second resonator with comb-shaped electrodes facing each other disposed on the piezoelectric substrate and with an input terminal and an output terminal, an output terminal of a third resonator with comb-shaped electrodes facing each other disposed on the piezoelectric substrate and with an input terminal and an output terminal is coupled to an input terminal of a fourth resonator with comb-shaped electrodes facing each other disposed on the piezoelectric substrate and with an input terminal and an output terminal, and an equivalent transmission line is coupled between a node between the first resonator and the second resonator and an input terminal of the third resonator, to form a band-pass filter. The phase of the transmission line can be adjusted from 5 degrees to 175 degrees arbitrarily at the series resonance frequency of the first or third resonator or at the parallel resonance frequency of the second or fourth resonator. As a result, the present invention allows the pass-band filter to be provided with arbitrary attenuation and the pass characteristics at a certain degree.

Preferably, the transmission line comprises π-type or T-type circuit connecting a capacitor in shunt-arm and an inductor in series-arm, to form a filter. As a result, the present invention allows the filter to reject undesired signal with a frequency higher than two times passband frequency.

Preferably, the transmission line comprises π-type or T-type circuit connecting an inductor in shunt-arm and a capacitor in series-arm, to form a filter. As a result, the present invention allows the filter to reject undesired signal with a frequency lower than a half passband frequency.

Preferably, with two or more filter circuits connected in series, transmission lines of some of the filter circuits have π-type or T-type circuit connecting a capacitor in shunt-arm and an inductor in series-arm and the transmission lines of the other filter circuits have π-type or T-type circuit connecting an inductor in shunt-arm and a capacitor in series-arm, to form a filter. As a result, the present invention allows the filter to reject undesired signal with a frequency higher than about two times the passband frequency and lower than about a half the passband frequency.

Preferably, each of the transmission lines includes one of the following elements: a capacitor with an inductor coupled in series connected in the shunt-arm so as for the series combined impedance to be the same value in the passband; a capacitor with an inductor coupled in parallel connected in the series-arm so as for the parallel combined admittance to be the same value in the passband; a inductor with a capacitor coupled in series connected in the shunt-arm so as for the series combined impedance to be the same value in the passband; or an inductor with a capacitor coupled in parallel connected in the series-arm so as for the parallel combined admittance to be the same value in the passband, to form a filter. This structure allows the filter to have an attenuation pole outside the band and to remove undesired signals efficiently.

Preferably, a SAW filter of the present invention comprises an equivalent transmission line configured in a multilayered body of dielectric material with relative dielectric constant less than ten (10) to form a filter, wherein the multilayered body is used as a part of an airtight seal material for the piezoelectric substrate. As a result, the present invention allows the SAW filter to be small size and low cost.

Preferably, the transmission line is made of silver or copper paste printed as main circuit material to form a filter. As a result, the present invention allows the SAW filter to have low loss.

(First Exemplary Embodiment)

Figure 1:
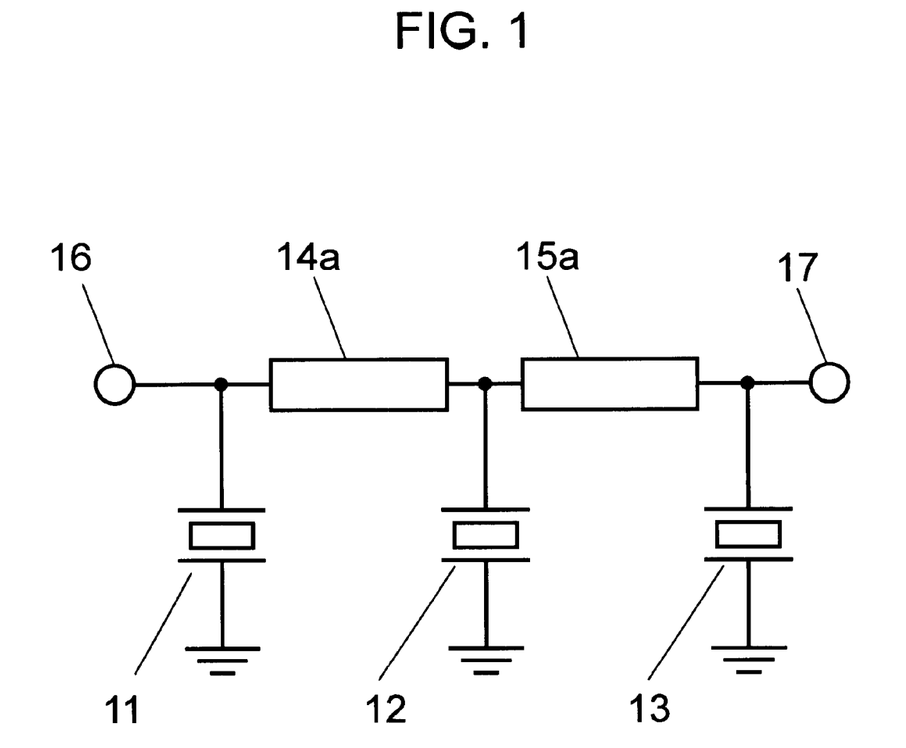
FIG. 1 shows a circuit diagram of a SAW filter in accordance with a first exemplary embodiment of the present invention.
Figure 2A:
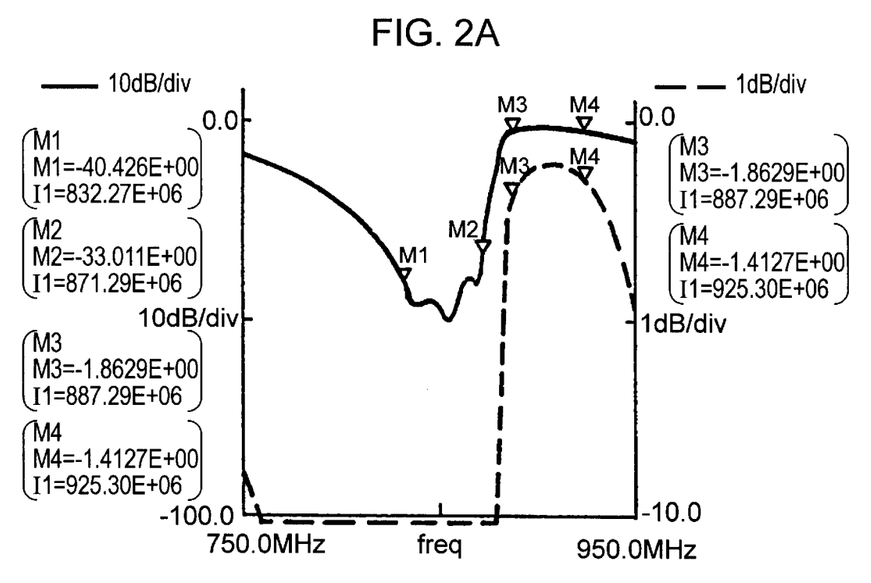
FIG. 2A shows an electrical characteristic of the same filter at a narrow range from 750 MHz to 950 MHz. Broken line shows the same in an expanded scale of ordinate.
Figure 2B:
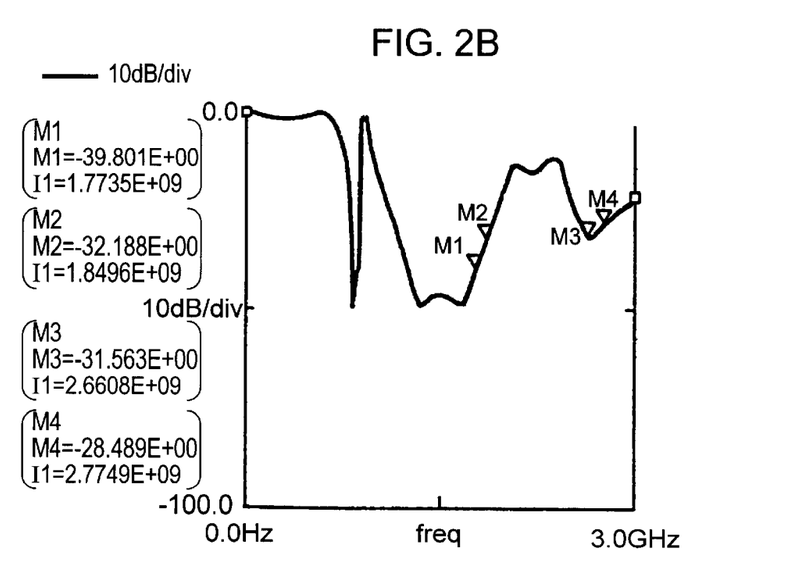
FIG. 2B shows an electrical characteristic of the same filter at a wide range from 0 Hz to 3.0 GHz.

FIG. 1 and FIG. 2 show a circuit diagram and electrical characteristics of a SAW filter respectively, in accordance with a first exemplary embodiment of the present invention. FIG. 1 shows SAW resonant elements 11, 12, 13 which are disposed on one piezoelectric substrate, transmission lines 14a, 14b, input terminal 16, and output terminal 17.

The piezoelectric substrate in this embodiment is made of lithium tantalate.

First, an operation of the circuit is described. SAW resonator 11 produces a series resonance at an attenuation frequency with zero ohms and a node between SAW resonator 11 and transmission line 14a is grounded. If an electric length of transmission line 14a is 90 degrees, an impedance measured from the opposite side (the side connected to SAW resonator 12) is open.

On the other hand, a frequency at which SAW resonator 12 is set is about the same as that of SAW resonator 11, so that an impedance at the node between SAW resonator 12 and transmission line 14a is also a short. Therefore, there is a big difference between the two impedances of the both sides of the node between transmission line 14a and SAW resonator 12. When the impedances on both sides viewed from a point within a high frequency circuit share a complex conjugate relation, a matching condition is normally satisfied. But the more deviation from the relation or the more mismatching allows the circuit to generate the more attenuation as pass characteristics. Therefore, the same effect is expected from connecting a transmission line between two SAW resonators.

In a real circuit, a relation between the impedances is complicated, so that it is not enough to set only the phase at 90 degrees. Adjusting behavior of impedance exchanger by optimizing a characteristics impedance and an electric length of a transmission line operating as an impedance exchange element allows a filter to have high attenuation and low insertion loss.

FIG. 2 shows that when the characteristic impedance and the line length for transmission lines 14a and 15a are 50 ohms/68 degrees and 50 ohms/55 degrees respectively in the circuit, the filter characteristics of the circuit is the loss 1.9 dB and the attenuation 33 dB in the passband. This means good characteristics.

The filter of the present invention comprises transmission lines 14a, 15a and SAW resonators 11, 12 and 13 as an example. With the characteristics impedance and the electric length optimized, the transmission line operating as an impedance exchange element allows the filter to get good filter characteristics. The transmission line remarkably operates as an impedance exchange element in the electric length range from 5 to 175 degrees, but does not operate at all at zero and 180 degrees.

(Second Exemplary Embodiment)

Figure 3A:
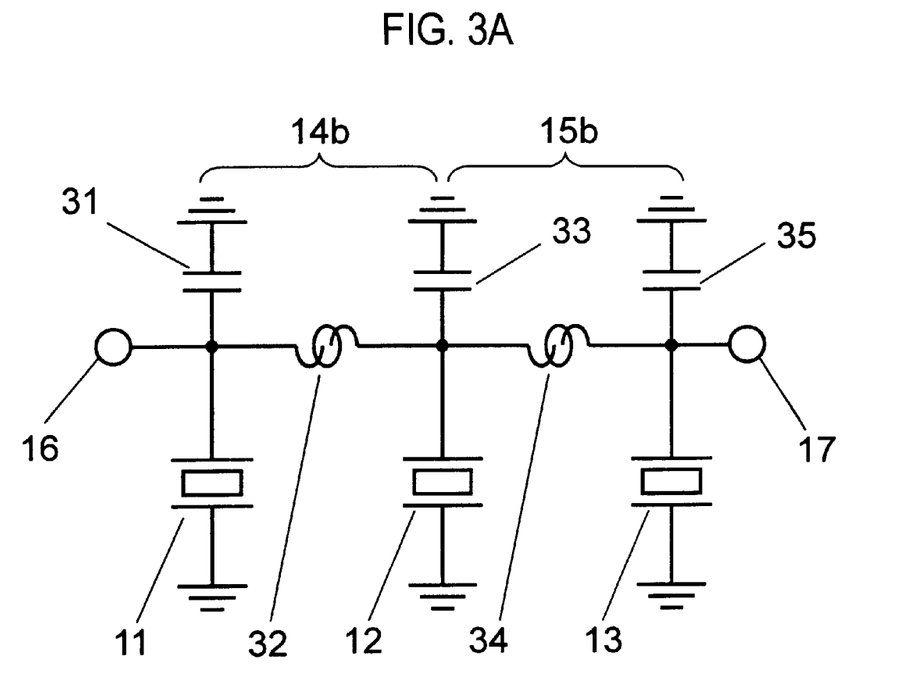
FIGS. 3A–3C show circuit diagrams of SAW filters in accordance with a second exemplary embodiment of the present invention.
Figure 3B:
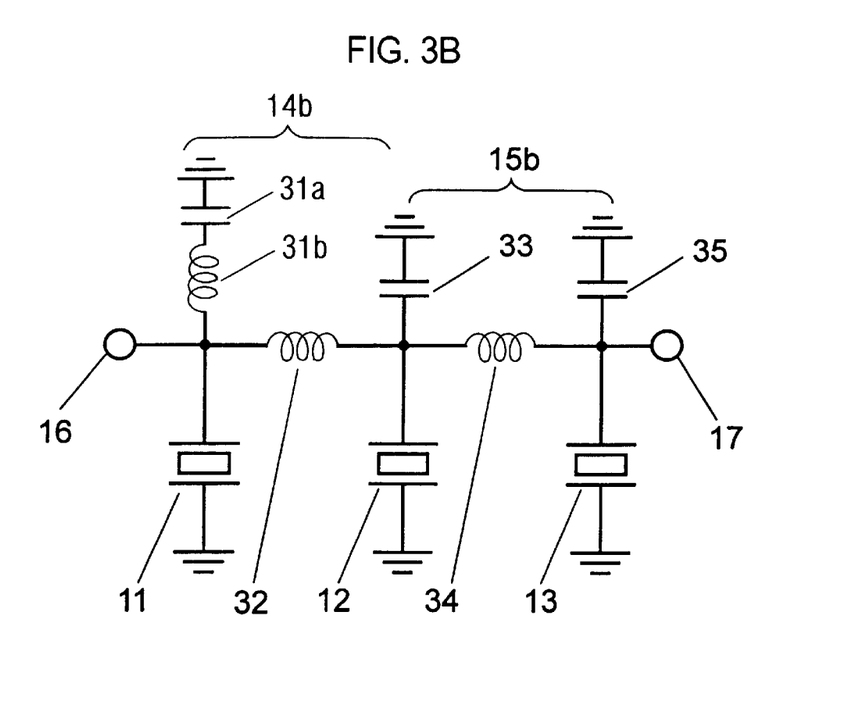
Figure 3C:
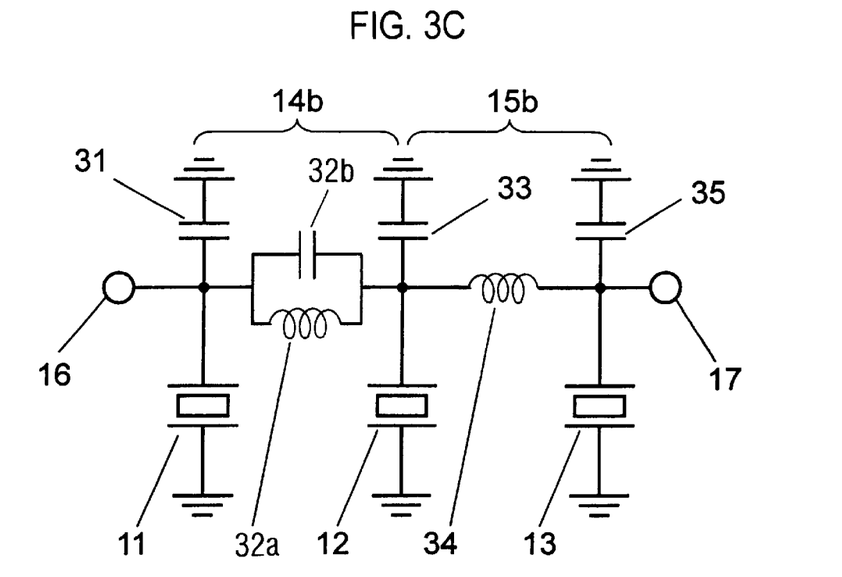

FIGS. 3A–3C and FIGS. 4A–4B show circuit diagrams and electrical characteristics of SAW filters respectively, in accordance with the second exemplary embodiment of the present invention. FIG. 3A shows circuit elements 31 to 35 which operate in the electrically equivalent manner to transmission lines 14a and 15a explained in FIG. 1, wherein the circuit structure of the embodiment is a low-pass π-type filter connecting a capacitor in shunt-arm and an inductor in series-arm. FIG. 3B is a modification of FIG. 3A in which element 31 is replaced with the series resonant of capacitor 31a and inductor 31b. The characteristics of this filter are shown in dashed lines in FIG. 4B. FIG. 3C is a modification of FIG. A in which element 32 is replaced with the parallel resonance of inductor 32a and capacitor 32b.

Figure 4A:
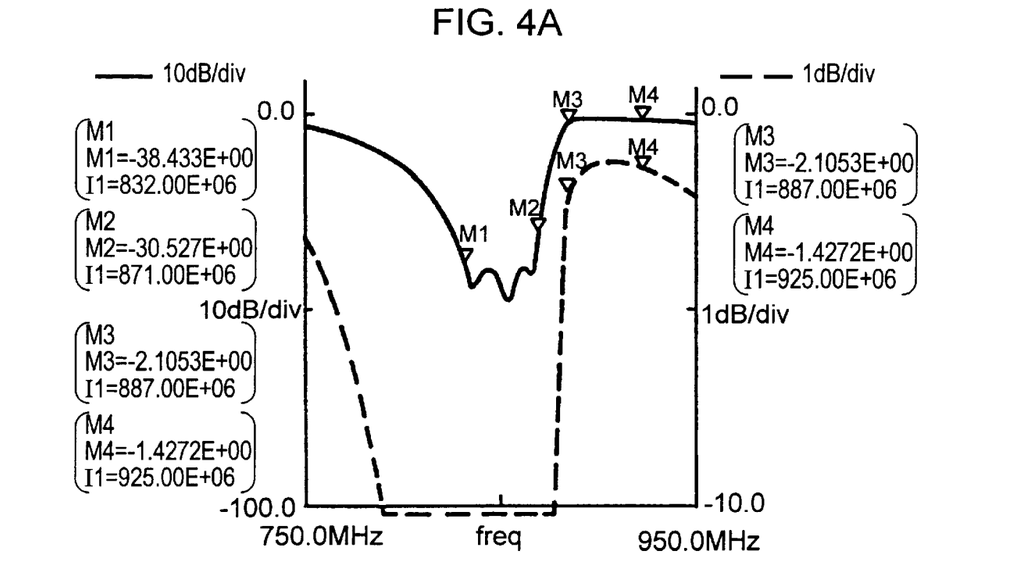
FIG. 4A shows an electrical characteristic of the same filter at a narrow range from 750 MHz to 950 MHz.
Figure 4B:
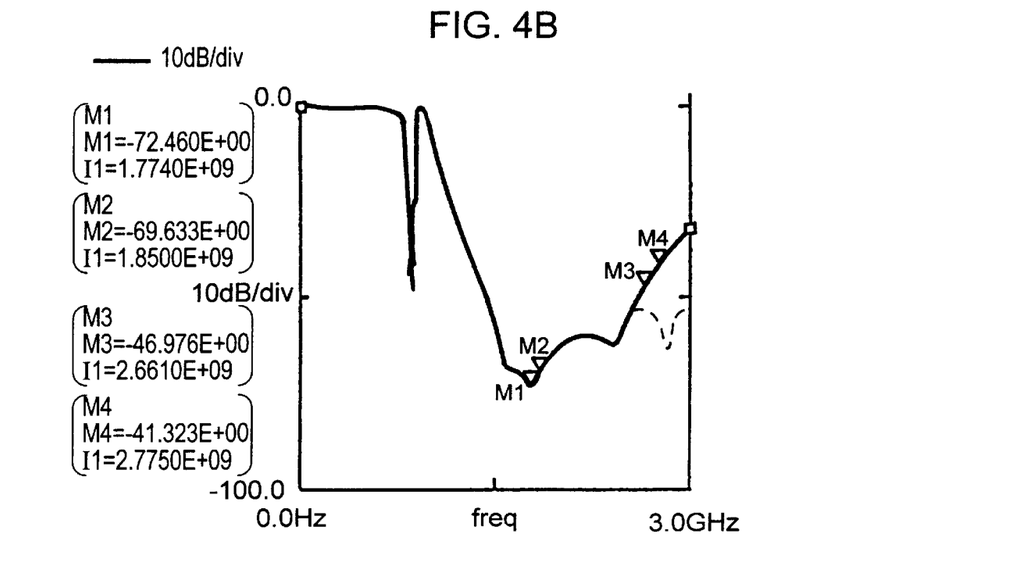
FIG. 4B shows an electrical characteristic of the same filter at a wide range from 0 Hz to 3.0 GHz.

FIG. 4 shows that the filter characteristics of the circuit is nearly as good as that of the first embodiment in the vicinity of the passband and larger attenuation than 40 dB in high frequency range. The reason is that finally the transmission lines of the present invention are equivalently converted into five concentrated constant elements, and the frequency characteristics of the impedances of the concentrated constant elements gets attenuation characteristics in high frequency range.

In this way, easy element modification, efficient development, and enhancing mass production yield for the filter are expected from the elements used in π-type connection for the transmission line, and in addition the elements allow the filter of the invention to have large attenuation characteristics especially in far high frequency range. The same effect is expected from a T-type circuit structure or a circuit structure of a high-pass T-type filter connecting an inductor in shunt-arm and a capacitor in series-arm, and the circuit structures allow the filter of the invention to have large attenuation characteristics especially in far low frequency range.

(Third Exemplary Embodiment)

Figure 5:
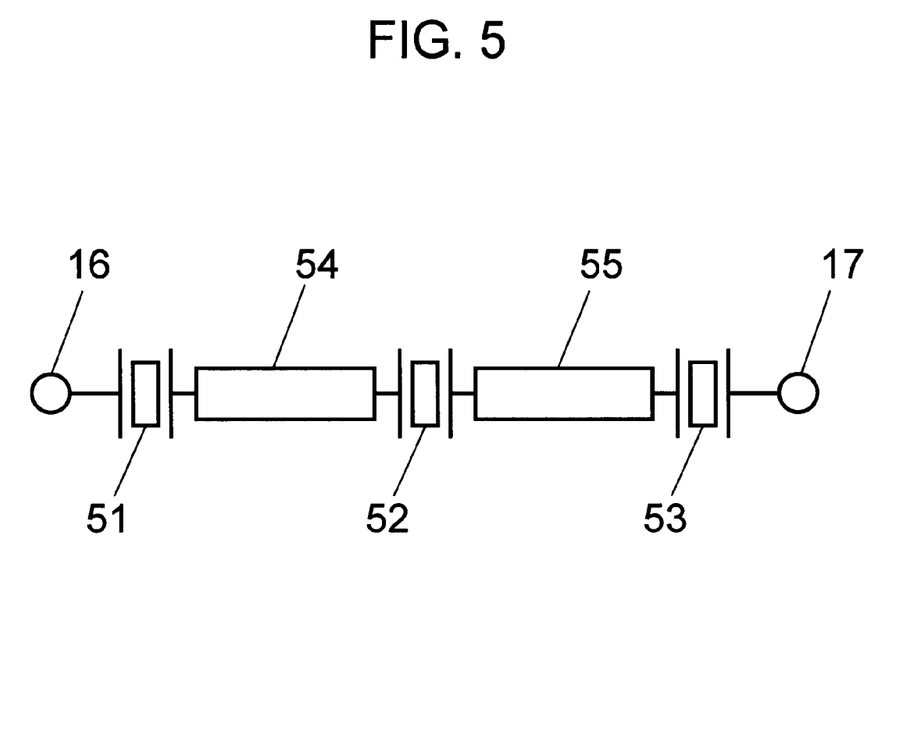
FIG. 5 shows a circuit diagram of a SAW filter in accordance with a third exemplary embodiment of the present invention.
Figure 6A:
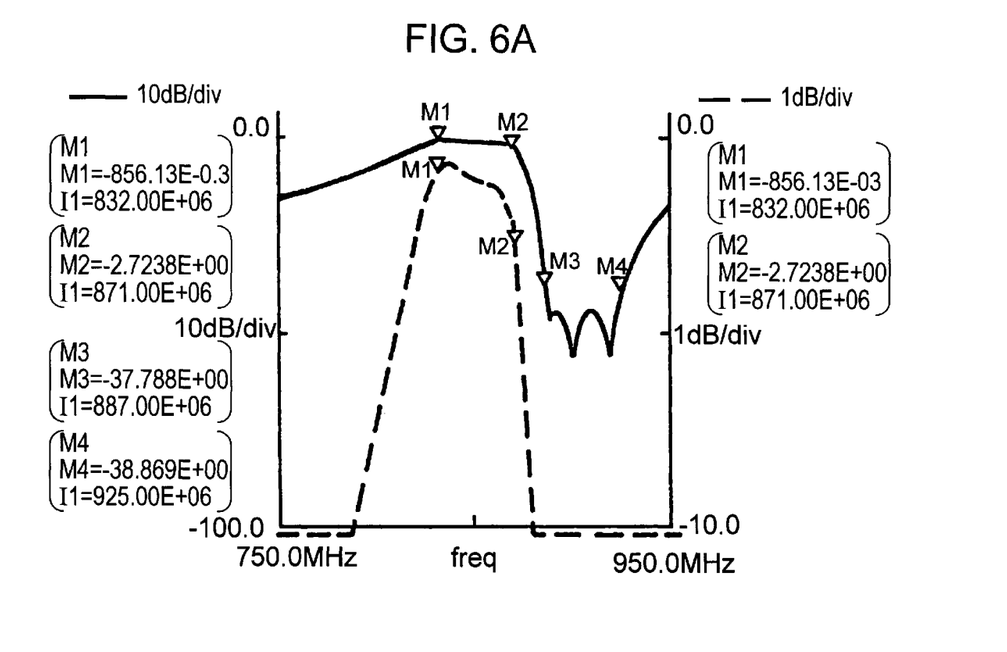
FIG. 6A shows an electrical characteristic of the same filter at a narrow range from 750 MHz to 950 MHz.
Figure 6B:
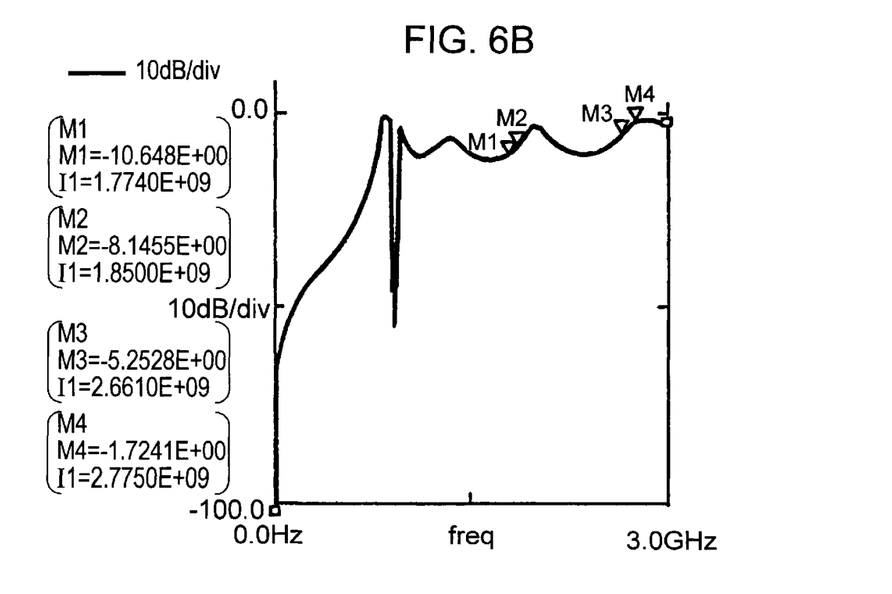
FIG. 6B shows an electrical characteristic of the same filter at a wide range from 0 Hz to 3.0 GHz.

FIG. 5 and FIG. 6 show a circuit diagram and electrical characteristics of a SAW filter respectively, in accordance with the third exemplary embodiment of the present invention. The figure shows SAW resonant elements 51, 52, 53 which are disposed on one piezoelectric substrate, transmission lines 54, 55, input terminal 16, and output terminal 17. The piezoelectric substrate in this embodiment is lithium tantalate.

FIG. 6 shows that when the characteristic impedance and the line length at the center frequency of the passband for transmission lines 54 and 55 are 66 ohms/79 degrees and 38 ohms/142 degrees respectively in the circuit, the filter characteristics of the circuit is the loss 2.7 dB, the attenuation 38 dB in the passband. This means good characteristics.

The filter of the present invention comprises transmission lines 54, 55 and SAW resonators 51 to 53 as an example. With the characteristic impedance and the electric length optimized, the transmission line operating as an impedance exchange element allows the filter to get good filter characteristics. The transmission line remarkably operates as an impedance exchange element in the electric length range from 5 to 175 degrees, but does not operate at all at zero and 180 degrees.

The filter of this embodiment is designed to set the series resonance point of the SAW resonators within the passband and the parallel resonance point of the SAW resonators within the attenuation band, so that the series resonance point of the SAW resonators must be lower than the parallel resonance point, therefore on the contrary to the first embodiment, the filter is especially effective for a case that attenuation is mainly required in frequency range over the passband.

(Fourth Exemplary Embodiment)

Figure 7A:
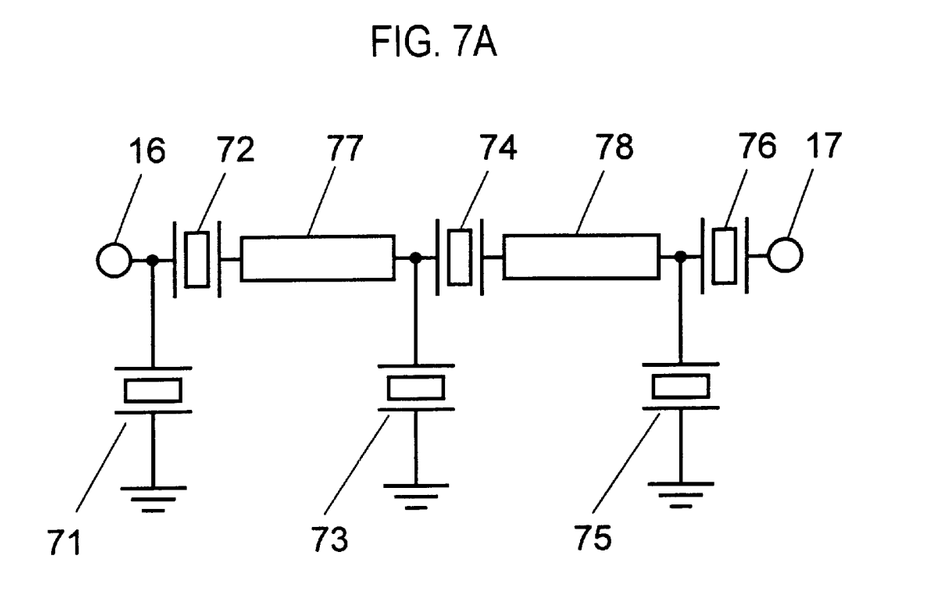
FIGS. 7A–7B show circuit diagrams of SAW filters in accordance with a fourth exemplary embodiment of the present invention.
Figure 7B:
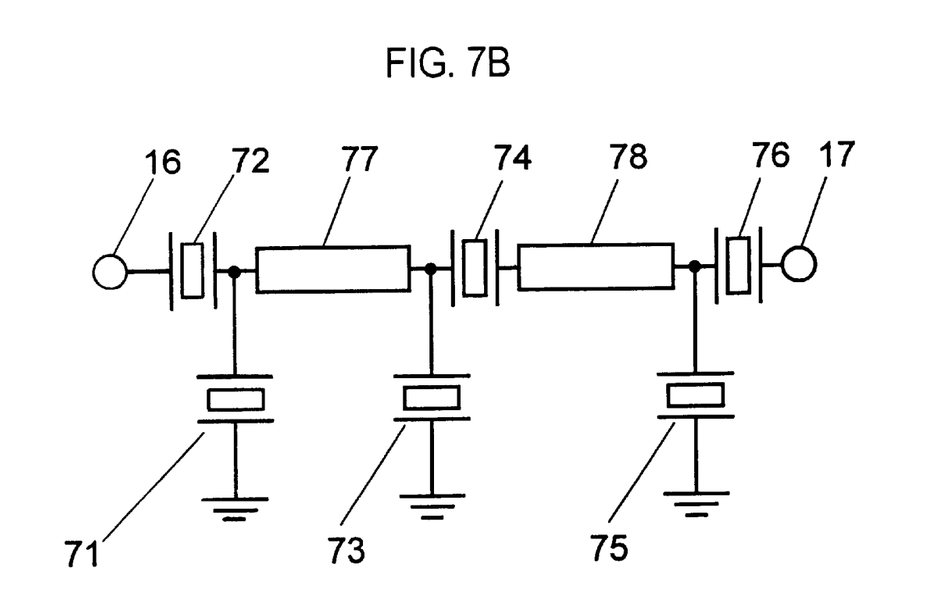
Figure 8A:
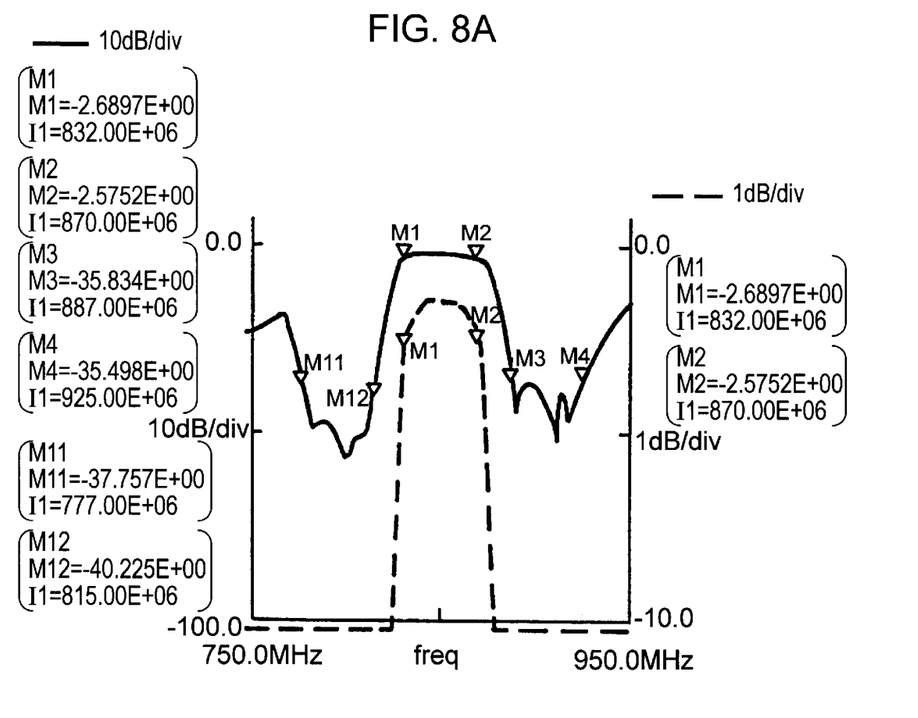
FIG. 8A shows an electric characteristic of the same filter at a narrow range from 750 MHz to 950 MHz.
Figure 8B:
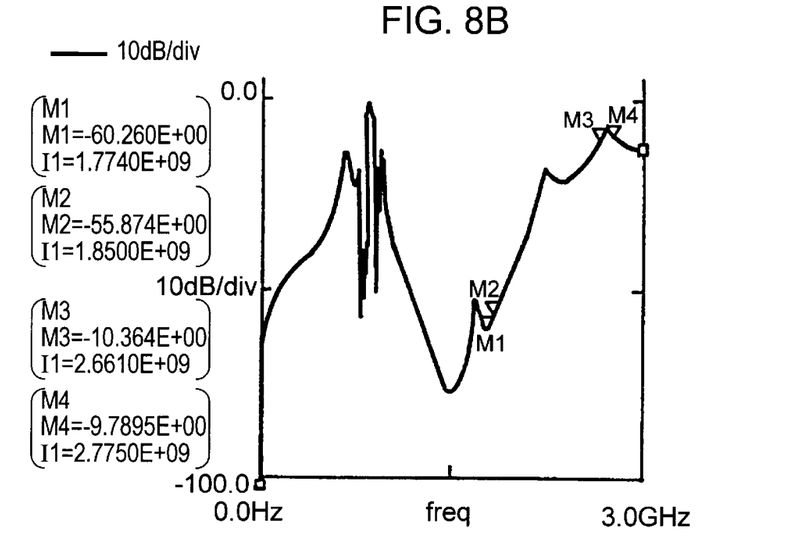
FIG. 8B shows an electrical characteristic of the same filter at a wide range from 0 Hz to 3.0 GHz.

FIGS. 7A–7B and FIG. 8 show circuit diagrams and electrical characteristics of SAW filters respectively, in accordance with the fourth exemplary embodiment of the present invention. The figures show SAW resonant elements 71 to 76 which are disposed on one piezoelectric substrate, transmission lines 77, 78, input terminal 16, and output terminal 17. The piezoelectric substrate in this embodiment is lithium tantalate.

FIG. 8 shows that when the characteristics impedance and the line length at the center frequency of the passband for transmission lines 77 and 78 are 43 ohms/102 degrees and 67 ohms/81 respectively in the circuit, the filter characteristics of the circuit is the loss 2.7 dB, the attenuation 35 dB in the passband. This means good bandpass characteristics.

The filter of the present invention comprises transmission lines 77, 78 and SAW resonator 71 to 76 as an example. With the characteristic impedance and the electric length optimized, the transmission line operating as an impedance exchange element allows the filter to get good filter characteristics. The transmission line remarkably operates as an impedance exchange element in the electric length range from 5 to 175 degrees, but does not operate at all at zero and 180 degrees.

The design concept for the filter of this embodiment is for the filter to configure a resonator group formed in ladder-type e.g. SAW resonators 71 and 72 as a unit and to get attenuation characteristics in frequency range under the passband with SAW resonators 71, 73, and 75 and attenuation characteristics in frequency range over the passband with SAW resonators 72, 74, and 76.

As described in the first and second exemplary embodiments, the same effect is expected from the filter using π-type or T-type equivalent circuit with capacitors and inductors for low-pass or high-pass characteristics. Then this embodiment allows the filter of the invention to have attenuation characteristics in a frequency range fairly far away from the passband.

In addition, this embodiment configuring one of the transmission lines as a high-pass type and the other as a low-pass type allows the filter to get characteristics combining broad band-pass filters and to reject undesired signal far from the band efficiently. Namely, this embodiment allows the filter of the present invention to get attenuation in a frequency range where SAW resonators only by themselves cannot attain the attenuation, while some conventional configurations specially need other filters to attain the attenuation. But the configuration of the present invention does not need such filters.

(Fifth Exemplary Embodiment)

Figure 9:
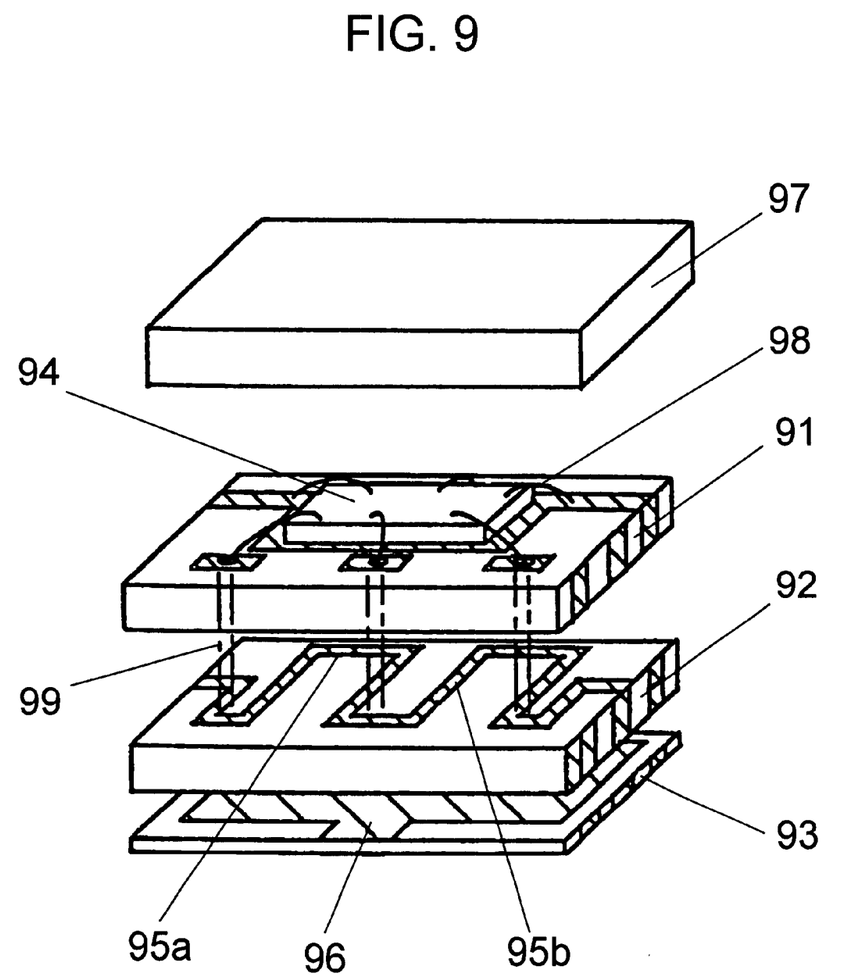
FIG. 9 shows an exploded isometric drawing of blocks of a SAW filter, in accordance with a fifth exemplary embodiment of the present invention.

FIG. 9 shows an exploded isometric drawing of blocks of a SAW filter, in accordance with the fifth exemplary embodiment of the present invention. The figure shows multilayered bodies 91 to 93 of dielectric sheets, piezoelectric substrate 94, transmission lines 95a and 95b formed by printing on multilayered body 92, shield electrode 96 formed by printing the same way, and cap 97 covering piezoelectric substrate 94.

Furthermore, this embodiment is a tangible form into which a circuit shown in FIG. 1 is put, where the SAW resonators formed on piezoelectric substrate 94 and transmission lines 95a and 95b are connected each other by via holes 99.

Designated values of characteristic impedance and electric length of transmission lines 95a and 95b are attained by width of the lines and clearance from upper/under grounding electrodes, or thickness of dielectric sheets 91 and 92 and physical length of the printed material.

The filter having a shield electrode disposed at the bottom makes the characteristic impedance stabilized. Therefore, it is better that the filter has the shield electrode so as well to reject an influence from some external element e.g. a pattern of a mother substrate.

With dielectric sheets multilayered, the configuration described above allows a SAW filter to be more miniaturized and higher reliable. And for example, a filter for cellular phone is estimated a few millimeters long. If the filter has strip line type transmission lines of tri-plate structure with multilayered body about one millimeter wide and 0.1 millimeter thick and the characteristic impedance is about 50 ohms, appropriate value of relative dielectric constant for the multilayered body is less than about ten (10). The dielectric materials are for example aluminum oxide, foresterite, and glass ceramic. Using silver, copper, or metallic material including high percentage of those metals allows the filter to have low loss.

INDUSTRIAL APPLICABILITY

As mentioned above, the present invention configures a filter comprising transmission lines operating as impedance exchange elements or bulk element circuits into which the transmission lines are equivalently converted and SAW resonators. Therefore, the filter attains large attenuation with a few stages. As a result, the present invention can configure a filter having band-stop or band-pass filter with large attenuation and low insertion loss characteristics.

What is claimed is:

1. A surface acoustic wave (SAW) filter for increasing attenuation in frequency close to a passband, comprising:
   (a) at least two resonators, each having comb-shaped electrodes facing each other disposed on one piezoelectric substrate, all input terminal and an output terminal; and
   (b) an equivalent transmission line connected between an output terminal of a first resonator and an input terminal of a second resonator, wherein phase of said equivalent transmission line is from 5 degrees to 175 degrees at a series resonance frequency of said resonators.

2. The surface acoustic wave (SAW) filter of claim 1, wherein the transmission lines are disposed in a multilayered body of relative dielectric constant not more than ten (10), said multilayered body is used as a part of an airtight seal material for said piezoelectric substrate.

3. The SAW filter of claim 1, wherein transmission line is printed with one of silver paste and copper paste as main circuit material.

4. The SAW filter of claim 1, wherein said SAW filters are connected in series, some of said SAW filters comprise equivalent transmission lines that have one of π-type circuit and T-type circuit connecting a capacitor in shunt-arm and an inductor in series-arm, the other of said SAW filters comprise equivalent transmission lines that have one of π-type circuit and T-type circuit connecting an inductor in shunt-arm and a capacitor in series-arm.

5. The SAW filter of claim 1, wherein said transmission line comprises one of π-type and T-type circuit connecting a capacitor in shunt-arm and an inductor in series-arm.

6. The SAW filter of claim 5, wherein the transmission line comprises one of a capacitor with an inductor coupled in series connected in the shunt-arm so as for the series combined impedance to be a same value in the passband and an inductor with a capacitor coupled in series connected in the shunt-arm so as for the series combined impedance to be a same value in the passband.

7. The SAW filter of claim 1, wherein said transmission line comprises one of π-type and T-type circuit connecting an inductor in shunt-arm and a capacitor in series-arm.

8. The SAW filter of claim 7, wherein the transmission line comprises one of a capacitor with an inductor coupled in parallel connected in the series-arm so as for the parallel combined admittance to be a same value in the passband, and an inductor with a capacitor coupled in parallel connected in the series-arm so as for the parallel combined admittance to be a same value in the passband.

9. A surface acoustic wave filter for increasing attenuation in frequency close to a passband, comprising:
   (a) at least two resonators, each having comb-shaped electrodes facing each other disposed on one piezoelectric substrate, an input terminal and an output terminal, wherein each output terminal of said resonators is grounded; and
   (b) an equivalent transmission line connected between the input terminals of said resonators, wherein phase of said equivalent transmission line is from 5 degrees to 175 degrees at the parallel resonance frequency of said resonators.

10. A surface acoustic wave filter for increasing attenuation in frequency close to a passband comprising:
   (a) a first resonator with comb-shaped electrodes facing each other disposed on one piezoelectric substrate and with an input terminal and an output terminal;
   (b) a second resonator with comb-shaped electrodes facing each other disposed on said piezoelectric substrate and with an input terminal and an output terminal;
   (c) a third resonator with comb-shaped electrodes facing each other disposed on said piezoelectric substrate and with an input terminal and an output terminal;
   (d) a fourth resonator with comb-shaped electrodes facing each other disposed on said piezoelectric substrate and with an input terminal and an output terminal; and
   (e) an equivalent transmission line, wherein the phase of said equivalent transmission line is from 5 degrees to 175 degrees at one of the series resonance frequency of one of said first and third resonators and the series resonance frequency of one of said second and fourth resonators,
   wherein the output terminal of said first resonator and the input terminal of said second resonator are coupled, the output terminal of said third resonator and the output terminal of said fourth resonator are coupled, and said equivalent transmission line is coupled between a node between said first resonator and said second resonator and a node between said third resonator and said fourth resonator.

11. A surface acoustic wave filter for increasing attenuation in frequency close to a passband, comprising:

(a) a first resonator with comb-shaped electrodes facing each other disposed on one piezoelectric substrate and with an input terminal and an output terminal;

(b) a second resonator with comb-shaped electrodes facing each other disposed on said piezoelectric substrate and with an input terminal and an output terminal;

(c) a third resonator with comb-shaped electrodes facing each other disposed on said piezoelectric substrate and with an input terminal and an output terminal;

(d) a fourth resonator with comb-shaped electrodes facing each other disposed on said piezoelectric substrate and with an input terminal and an output terminal; and (e) an equivalent transmission line, wherein the phase of said equivalent transmission line is from 5 degrees to 175 degrees at one of the series resonance frequency of one of said first and third resonator and the parallel resonance frequency of one of said second and fourth resonator, wherein the output terminal of said first resonator and the input terminal of said second resonator are coupled, the output terminal of said third resonator and the input terminal of said fourth resonator are coupled, and said equivalent transmission line is coupled between a node between said first resonator and said second resonator and the input terminal of said third resonator.

* * * * *